United States Patent
Kim et al.

(10) Patent No.: US 6,615,385 B1
(45) Date of Patent: Sep. 2, 2003

(54) ITERATIVE DECODER AND AN ITERATIVE DECODING METHOD FOR A COMMUNICATION SYSTEM

(75) Inventors: Min-Goo Kim, Suwon-shi (KR); Beong-Jo Kim, Songnam-shi (KR); Young-Hwan Lee, Songnam-shi (KR); Soon-Jae Choi, Songnam-shi (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/475,684

(22) Filed: Dec. 30, 1999

(30) Foreign Application Priority Data

Dec. 31, 1998 (KR) ........................................ 1998-62709

(51) Int. Cl.$^7$ ........................ H03M 13/29; H03M 13/45

(52) U.S. Cl. ........................................ 714/758; 714/794

(58) Field of Search ................................ 714/795, 796, 714/794, 758

(56) References Cited

U.S. PATENT DOCUMENTS

| | | | |
|---|---|---|---|
| 4,271,520 A | 6/1981 | Coombes et al. | 371/42 |
| 6,182,261 B1 * | 1/2001 | Haller et al. | 714/758 |
| 6,233,709 B1 * | 5/2001 | Zhang et al. | 714/774 |
| 6,289,486 B1 * | 9/2001 | Lee et al. | 714/701 |
| 6,292,918 B1 * | 9/2001 | Sindhushayana et al. | 714/755 |

FOREIGN PATENT DOCUMENTS

| | | | |
|---|---|---|---|
| EP | 0 820 159 | 7/1997 | |
| JP | 10-135888 | 5/1998 | |
| JP | 2000-515715 | 11/2000 | |
| KR | 10-0203722 | 3/1991 | H03M/7/00 |
| KR | 1998-703844 | 12/1998 | G11B/20/10 |
| WO | WO 99/52216 | 10/1999 | |

OTHER PUBLICATIONS

Leung, Oliver Yuk–Hang, et al., "Reducing Power Consumption of Turbo Code Decoder Using Adaptive Iteration with Varible Supply Voltage", Proc. 1999 International Symposium on Low Power Electronics and Design, Aug. 16–17, 1999, San Diego CA, pp. 36–41.*

(List continued on next page.)

Primary Examiner—Stephen M. Baker
(74) Attorney, Agent, or Firm—Dilworth & Barrese, LLP

(57) ABSTRACT

An iterative decoder and iterative decoding method. In the iterative decoder, a first adder has a first port for receiving information symbols and a second port. A first component decoder which is coupled to the first adder, receives first parity symbols and decodes the information symbols using first parity symbols and an output signal of the first adder. A first subtractor has a third port for receiving the output of the first component decoder, and a fourth port. An interleaver which is coupled to the output of the first subtractor, interleaves the decoded information symbols received from the first component decoder. A second component decoder receives the output of the interleaver and second parity symbols and decodes the information symbols of the interleaver output using the received signals. A deinterleaver deinterleaves the output of the second component decoder. A second subtractor has a fifth port for receiving the output of the deinterleaver and a sixth port for receiving an inverted output of the first subtractor. The output of the second subtractor is connected to the second port and an inverted output of the second subtractor is connected to the fourth port. A hard decision device converts the decoded symbols received from the first component decoder to binary information bits. An error detector checks errors in the binary information bits received from the hard decision device and generates a no error signal if no errors are detected. An output buffer stores the binary information bits received from the hard decision device and outputs the stored binary information bits in response to the no error signal.

20 Claims, 3 Drawing Sheets

OTHER PUBLICATIONS

Chang et al., "Q–ary Turbo Codes with QAM Modulation", 5th International Conference on Universal Personal Communications, 1996, pp. 814–817.*

Narayanan et al., "Selective Serial Concatenation of Turbo Codes", IEEE Communications Letters, vol. 1, No. 5, Sep. 1997, pp. 136–139.*

Pietrobon, "Implementation and Performance of a Turbo/MAP Decoder", International Journal of Satellite Communications, vol. 16, No. 1, Jan.–Feb. 1998, pp. 23–46.*

Pietrobon, "A Turbo/MAP Decoder for use in Satellite Circuits", International Conference on Information, Communications and Signal Processing, 1997, pp. 427–431.*

Narayanan et al., "List Decoding of Turbo Codes", IEEE International Conference on Communications, 1998, pp. 141–145.*

Moher et al., "Cross–Entropy and Iterative Coding", IEEE Transactions on Information Theory, vol. 44, No. 7, Nov. 1998, pp. 3097–3104.*

Japanese Office Action dated Sep. 17, 2002 issued in a counterpart application, namely, Japanese Appln. No. 2000–592947.

Copy of International Search Report, PCT/KR99/00844.

* cited by examiner

ITERATIVE DECODER AND AN ITERATIVE DECODING METHOD FOR A COMMUNICATION SYSTEM

PRIORITY

This application claims priority to an application entitled "Iterative Decoder and Iterative Decoding Method for Communication System" filed in the Korean Industrial Property Office on Dec. 31, 1998 and assigned Ser. No. 98-62709, the contents of which are hereby incorporated by reference.

BACKGROUND OF THE INVENTION

1. Field of the Invention

The present invention relates generally to a receiver in a communication system, and in particular, to a device and method for decoding an input signal.

2. Description of the Related Art

A transmitter in a radio communication system such as a satellite system, or a system using W-CDMA or CDMA 2000, can use a forward error correction code to ensure reliable data transmission. The receiver subjects the received data to iterative decoding, which feeds back the output of a component decoder to the input for decoding. The component decoder outputs not a hard decision signal, like a high (+1) or low (−1) signal, but a soft value (e.g., 0.7684, −0.6432, . . . ).

This interleaved sequence is input to a second component decoder, which decodes it. An iterative decoder is composed of at least two component decoders. An interleaver between the component decoders permutes the bit sequence of a frame output from a first component decoder. When the decoded interleaver signal is output for feedback to the first component decoder, a deinterleaver rearranges the bits of the decoded interleaved signal in their original order.

The turbo decoder is a preeminent example of iterative channel decoders. Iterative decoders, such as a turbo decoder, increase their error correction performance by many iterations of decoding.

In the conventional iterative decoding method, data decoding occurs a predetermined number of times without checking whether errors have been generated during the iterative decoding. Errors are checked by subjecting the deinterleaver output to hard decision decoding.

In the case of typical iterative decoding, however, the greatest decoding gain is generally obtained during the first two or three decodings, though this varies with the channel environment. In fact, error correction performance resulting from iterative decoding may rapidly drop after a number of decodings. Furthermore, after a certain number of iterative decodings, system resources, like power consumption and processing delay, are being dissipated for a marginal performance gain. For example, a certain number of iterative decodings can cause signal oscillations due to the feedback characteristics of the iterative decoder. In other words, perfectly error-corrected data can actually begin to generate errors as decoding is repeated.

The problem of the threshold number (the iteration number beyond which errors may be generated) of iterative decodings is overcome by appropriately picking the number of decoding iterations. If it can be determined that the probability that all errors have been correct is approximately 1 the iterative decoder need not decode, the input signal any further. Whether decoding is completed can be determined in several ways. One of them is to check errors utilizing a CRC (Cyclic Redundancy Code) check of decoder output. Because the CRC check does not alter the information to be transmitted, it is impossible, for the CRC check to generate errors in the decoded data. However, the challenging task for a system designer is to limit the additional processing delay that would be involved in performing an error check in the iterative decoding scheme. Therefore, a need exists for a device and method of limiting the number of iterations in an iterative decoder by performing an error check on the decoded data without incurring undue processing delay.

SUMMARY OF THE INVENTION

It is, therefore, an object of the present invention to provide an iterative decoder and iterative decoding method for dynamically determining the appropriate number of decoding iterations of received data.

It is another object of the present invention to provide an iterative decoder and iterative decoding method, in which the output of each component decoder is checked for the presence or absence of errors while decoding.

It is a third object of the present invention to provide an iterative decoder and iterative decoding method, in which the output of each component decoder is checked for the presence or absence of errors while decoding and which stops decoding immediately if no errors are detected.

It is a fourth object of the present invention to provide an iterative decoder and iterative decoding method, in which the processing delay is minimized during an error check of each component decoder output during decoding.

It is a fifth object of the present invention to provide an iterative decoder and iterative decoding method, in which the output of each component decoder is checked for the presence or absence of errors while decoding and which stops decoding immediately if no errors are detected, in a continuous mode It is a sixth object of the present invention to provide an iterative decoder and iterative decoding method, in which the output of each component decoder is checked for the presence or absence of errors at the time when the output of the component decoder is arranged in the original order and stops decoding immediately if no errors are detected, in a continuous mode.

It is a seventh object of the present invention to provide an iterative decoder and iterative decoding method, in which, when each component decoder is operated in a continuous mode, one frame is subjected to an error check simultaneously with completion of decoding that one frame in a first component decoder and decoding is immediately stopped if no errors are detected.

Briefly, these and other objects are achieved by providing an iterative decoder. In the iterative decoder, a first adder has a first port for receiving information symbols and a second port; a first component decoder is coupled to the first adder, for receiving first parity symbols and decoding the information symbols using the first parity symbols and an output signal of the first adder; a first subtractor has a third port for receiving the output of the first component decoder, and a fourth port; an interleaver coupled to the output of the second adder, for interleaving the decoded information symbols received from the first component decoder; a second component decoder receives the output of the interleaver and second parity symbols and decodes the information symbols of the interleaver output using the received signals; a deinterleaver deinterleaves the output of the second component decoder; a second subtractor has a fifth port for receiving the output of the deinterleaver and a sixth port for receiving an inverted output of the second adder, the output of the second subtractor connected to the second port and an inverted output of the second subtractor connected to the fourth port; a hard decision device converts the decoded symbols received from the first component decoder to binary information bits; an error detector checks for errors in the binary information bits received from the hard decision device and generates a no error signal if no errors are detected; and an output buffer stores the binary information bits received from the hard decision device and outputs the stored binary information bits in response to the no error signal.

In the iterative decoding method for an iterative decoder having a predetermined maximum number of iterations, the method includes the steps of: iterative decoding an input frame signal; checking for errors in the decoded frame data before the predetermined number of iterations are completed; and outputting the decoded frame if no errors are detected.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described hereinbelow with reference to the accompanying drawings. In the following description, well-known functions or constructions are not described in detail since they would obscure the invention in unnecessary detail.

Figure 1:
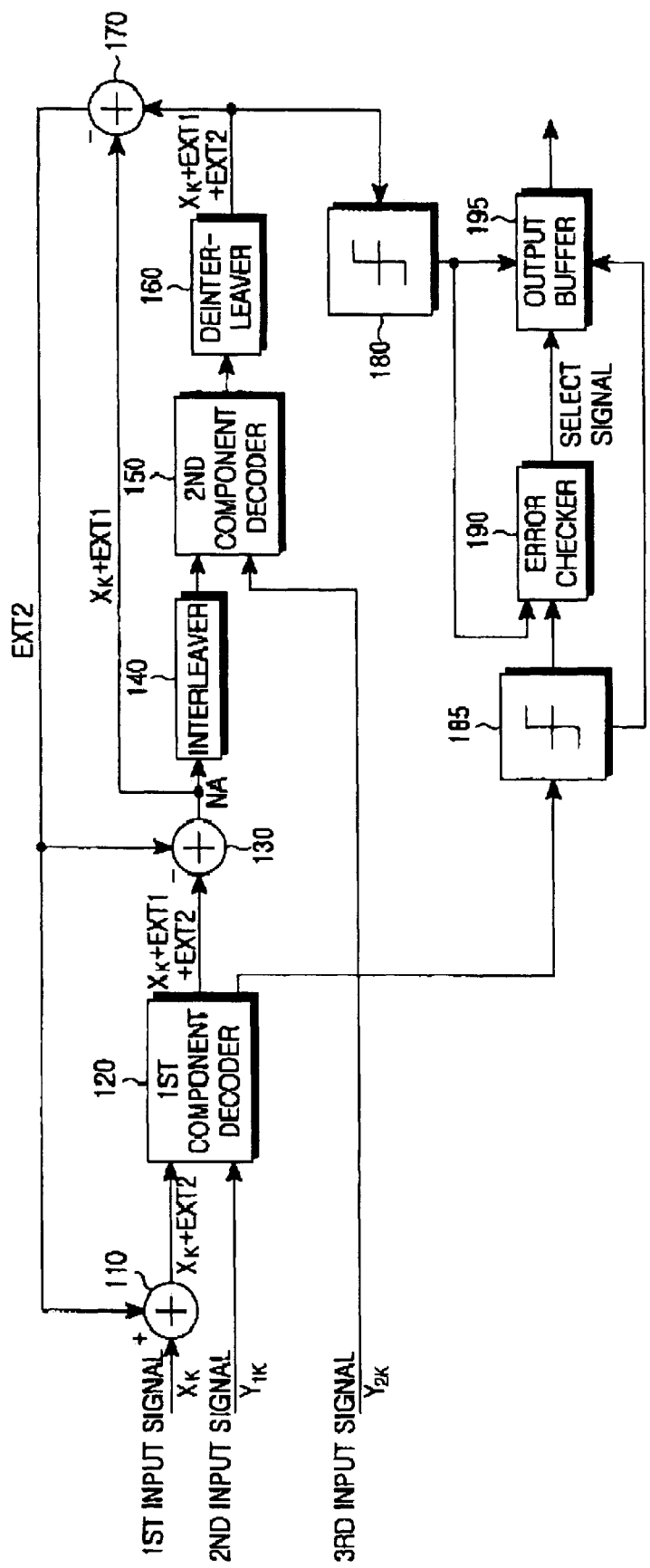
FIG. 1 is a block diagram of an iterative decoder with a code rate of ⅓ according to an embodiment of the present invention.

FIG. 1 is a block diagram of an iterative decoder with a code rate of ⅓ according to an embodiment of the present invention.

The first, second, and third input signals are signals demodulated and quantized by a demodulator (not shown) in a receiver (not shown). The first, second and third signals are a systematic signal $X_k$, a parity signal $Y_{1k}$, and another parity signal $Y_{2k}$, respectively. The second and third input signals are redundant values added to the original data for error correction, are obtained by turbo encoding the systematic signal $X_k$, and are also turbo-encoded and interleaved by a transmitter.

First and second component decoders 120 and 150, respectively, can operate in a continuous mode. RESOVA (Register Exchange Soft Output Viterbi Algorithm) decoders can be used as the first and second component decoders 130 and 150. For the input of each soft signal value of a group of bits such as a frame, the first and second component decoders 120 and 150 output each decoded soft signal value continuously. In a continuous mode, the first and second component decoders 120 and 150 output one decoded soft output signal value for one soft input signal value without delay, as long as an initial delay of the window size or decoding depth D is neglected. Each decoded soft signal value output from the first component decoder 120 is converted to a high or low value through hard decision by a hard decision device 185 and then applied to an error checker 190 without delay. The error checker 190 can be a CRC checker.

Due to the fact that the signal values flow without any delay, the error checker 190 completes an error check on one frame with hard decision signal values simultaneously when the first component decoder 120 completely decodes the same one frame. That is, each decoded soft signal value output from the first component decoder 120 is converted to a high or low value through hard decision by the hard decision device 185 and is then applied to the error checker 190 bit by bit without delay. The output of the hard decision device 185 is stored in an output buffer 195. In terms of the hardware, the first component decoder 120 outputs one decoded soft signal value at every clock count and feeds it to each register of the error checker 190 without any delay. Thus, the decoding of one frame in the first component decoder 120 is completed simultaneously with completion of an error check on the frame in the error checker 190.

If no errors are detected in the input frame, the error checker 190 stops the iterative decoding of the frame and outputs the one decoded frame stored in the output buffer 195. On the other hand, if errors are detected, the error checker 190 performs an error check again during the next decoding time. In another embodiment of the present invention, an error check is performed at the output of the deinterleaver 160. The iterative decoding can occur a predetermined number of times. If there are no errors at the next decoding time, the output buffer 195 outputs a decoded frame from the second component decoder 150. In other words, the second component decoder 150 only operates when the first decoder 120 does not remove all errors. When the second component decoder 150 operates, its output is buffered in output buffer 195, thus overwriting the previous frame from the first decoder 120.

An adder 110 adds $X_K$ to an extrinsic information signal EXT2 fed back from a second subtracter 170. EXT2 does not exist in initial decoding and is a signal component resulting from decoding in the second component decoder 150. From the input of the added signal ($X_K$+EXT2) from the first adder 110 and $Y_{1K}$, the first component decoder 120 outputs a primary decoded signal including $X_K$, EXT1, and EXT2 components. A first subtracter 130 subtracts the EXT2 component from the output of the first component decoder 120. Namely, the signal at node NA consists of $X_K$ and EXT1 components. The hard decision device 185 converts the first component decoder 120 output signal (including $X_K$, EXT1, and EXT2 components) in their original order, to high or low values through hard decision analysis and feeds the converted values to the error checker 190 without a delay.

An interleaver 140 permutes the sequence of the signal ($X_K$30 EXT1) received from the first subtracter 130 by interleaving, and outputs an interleaved signal of $X_K$+EXT1 components. The second component decoder 150 decodes the output of the interleaver 140 using $Y_{2K}$, and outputs a secondary decoded signal including $X_K$, EXT1, and EXT2 components. A deinterleaver 160 rearranges the output of the second component decoder 150 in its original data order by deinterleaving. The second subtracter 170 subtracts the signal ($X_K$+EXT1) received from the node NA from the rearranged decoded soft signal including $X_K$, EXT1, and EXT2 components received from the deinterleaver 160. The difference signal is fed back as the extrinsic information signal EXT1 to the first adder 110.

After the deinterleaver 160 rearranges $X_K$ in its original data order by deinterleaving the output of the second component decoder 150 as stated above, the error checker 190 can check errors in the output of the deinterleaver 160 received through a hard decision device 180.

As the above iterative decoding proceeds, soft signal values output from the first or second component decoder 120 or 150 generally have an improved error correction performance. The error checker 190 checks errors in the output of each component decoder until the output of one of the decoders is error-free at a certain time point. When this occurs, the error checker 190 stops the iterative decoding and the output buffer 195 outputs the error-free decoded signal. That is, if the decoded data is error-free before a prescribed number of decodings are completed, the iterative decoding is stopped, the error-free decoded data is output, and then the next frame is input.

In the iterative decoder shown in FIG. 1, the error check of each component decoder's output and decoding can occur at the same time without an additional processing delay in hardware. If no errors are detected in the check, the iterative decoding can be stopped immediately. Consequently, excessive decoding is prevented, which, in turn, prevents the overuse of system resources and excessive decoding-caused errors.

The deinterleaver 160 rearranges the output of the second decoder 150 in its original data order by deinterleaving prior to an error-check on the output of the second component decoder 150 in the error checker 190. Therefore, the error checker 190 can check errors in the output of the second component decoder 150 after a one frame-delay. This delay is caused by the fact the decoded sequence from the second decoder must be saved before the sequence is deinterleaved. The output of the iterative decoder is subjected to an error check when it is arranged in its original data order.

Figure 2:
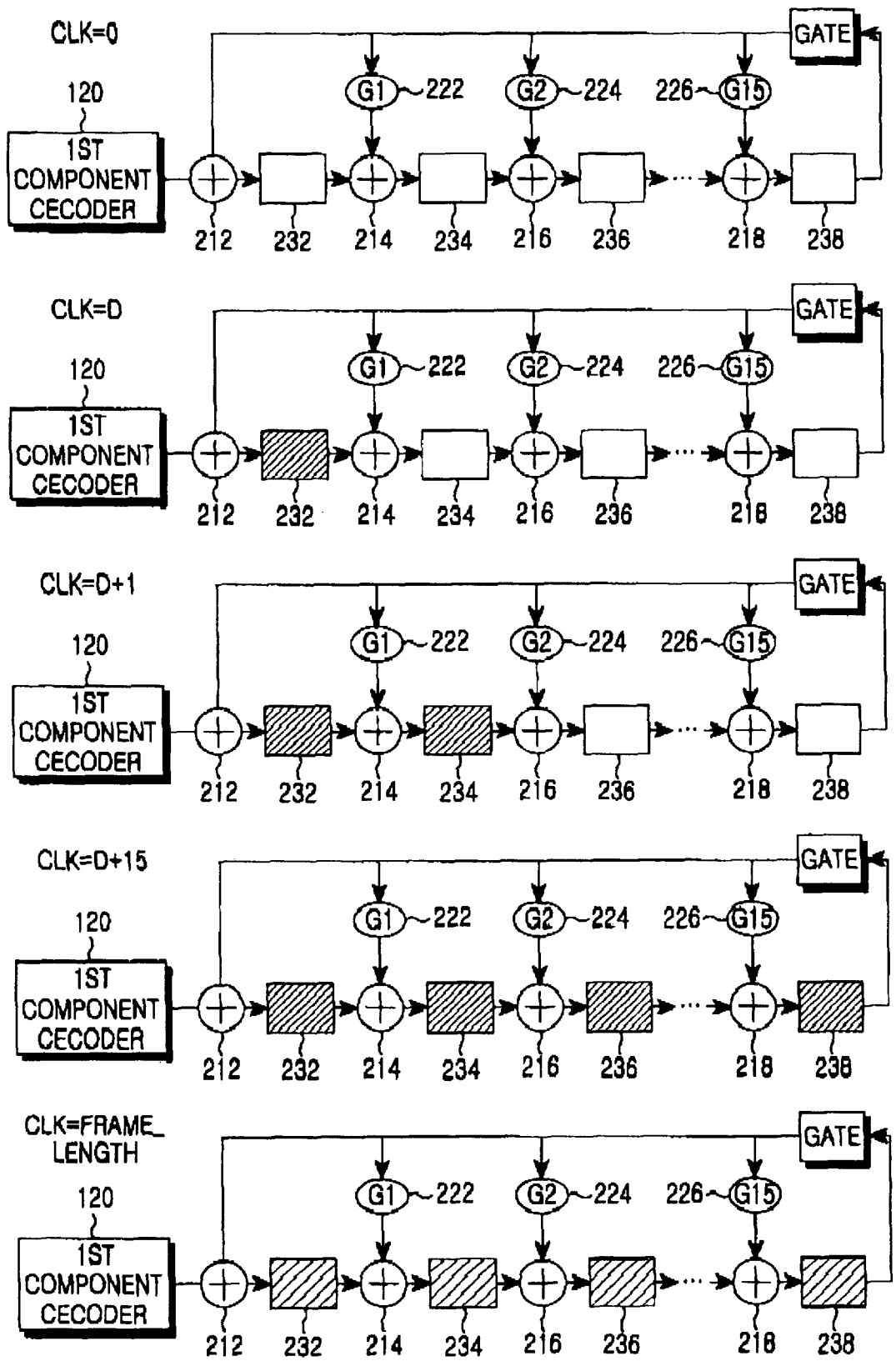
FIG. 2 is a block diagram of an error checker shown in FIG. 1 for describing its operation according to an embodiment of the present invention.

FIG. 2 is a block diagram of the operation of the error checker 190 from FIG. 1 according to an embodiment of the present invention. Here, the error checker 190 is assumed to be a CRC error checker.

Referring to FIG. 2, the CRC error checker is composed of shift registers 232 to 238 serially connected. CRC polynomial coefficients G1 222 to G15 226 are preset to values of 0 s or 1 s. XOR gates 212 to 218 XOR-operates the coefficients and the outputs of the shift registers. When the clock count is 0, the first component decoder 120 has no output and the CRC error checker is inoperative. When the clock count is D, where D equals the decoding depth of the first component decoder 120, the CRC error checker CRC-checks the hard-decision output of the first component decoder 120, while shifting it bit by bit, as shown in FIG. 2. That is, the first component decoder outputs a signal value to a shift register at every clock count, and at the same time, the CRC error checker calculates a syndrome. Consequently, the CRC error checker can check errors in one frame simultaneously with the first component decoder completing decoding of the same frame.

For a detailed description of the operation of the CRC error checker, see "Error Control Coding: Fundamentals and Applications" Shu Lin and Daniel J. Costello Jr., Prentice Hall, p. 99.

Figure 3:
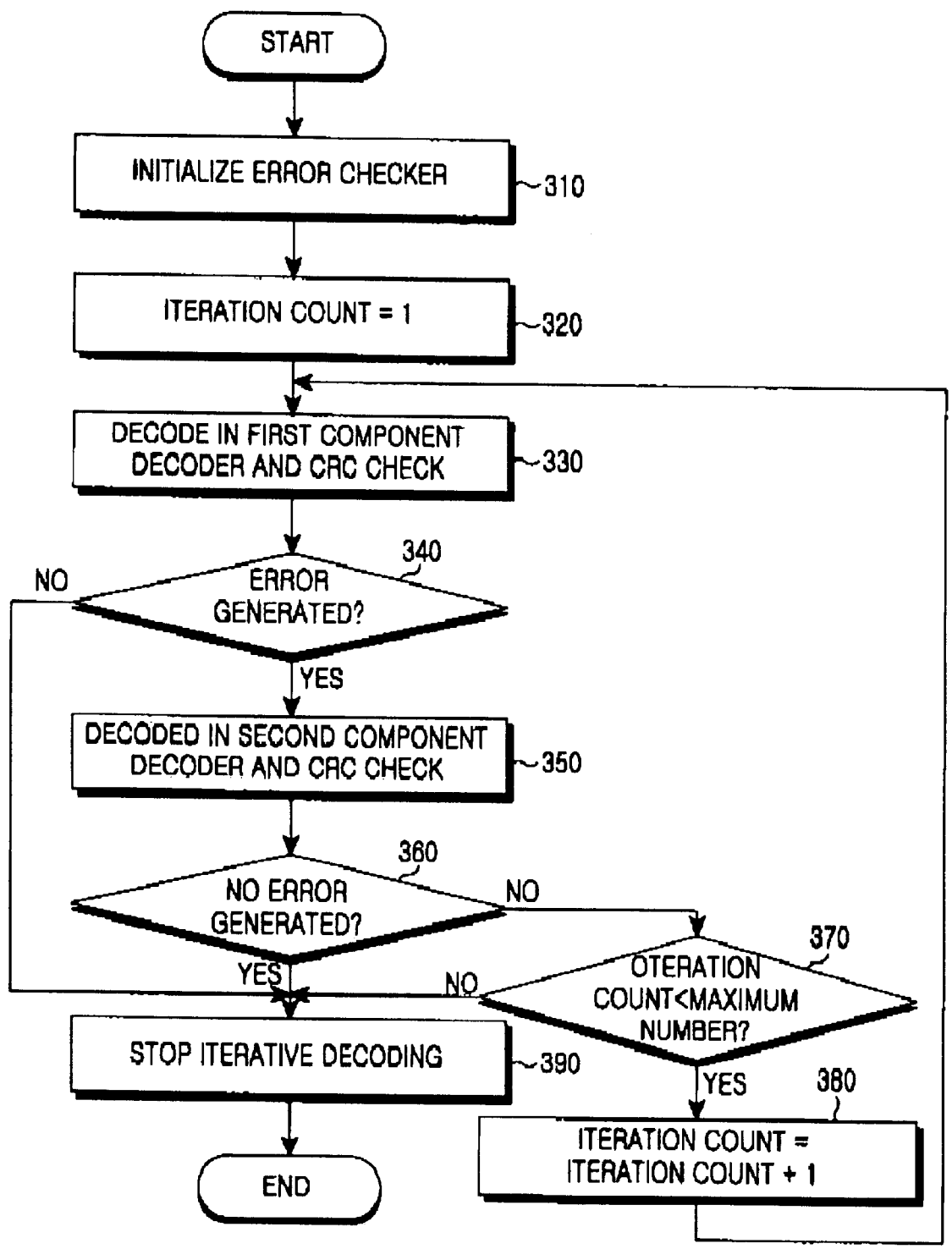
FIG. 3 is a flowchart illustrating an iterative decoding method according to an embodiment of the present invention.

FIG. 3 is a flowchart illustrating an iterative decoding method according to an embodiment of the present invention.

Referring to FIG. 3, the error checker 19 is initialized under the control of a controller in step 310. The initialization of the error checker 190 is equivalent to initialization of the shift registers. The controller sets the iteration count to 1 in step 320 and the first component decoder 120 decodes input soft values and outputs decoded soft values sequentially in step 330. At the same time, the error checker 190, receives the hard-decision output of the first component decoder 120 without a delay and checks errors in the received signal, under the control of the controller. Therefore, the decoding and the error check of one frame are completed at the same time in the first component decoder 120 and the error checker 190, respectively.

If the error checker 190 detects no errors in step 340, it stops the iterative decoding and outputs one decoded frame through the output buffer 195 under the control of the controller in step 390. On the other hand, if errors exist in step 340, the second component decoder 150 decodes the frame of soft signal values under the control of the controller and outputs the decoded soft signal values sequentially in step 350. The error checker 190 checks errors in the hard-decision deinterleaver output, that is, the output of the second component decoder 150 under the control of the controller. If no errors are generated in step 360, the error checker 190 performs step 390 under the control of the controller. If there are errors in step 360, the controller determines whether the current iteration count exceeds a maximum iteration value in step 370. If the former is greater than or equal to the latter, the controller deletes the contents of the output buffer 195. If not, the controller increments the iteration count by one in step 380 and returns to step 330.

In accordance with the iterative decoder and iterative decoding method according to an embodiment of the, present invention as described above, iterative decoding is stopped immediately if a plurality of input signals are decoded without error and there is no processing delay is involved in the error check, thereby saving system resources.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An iterative decoder comprising:
   a first adder having a first port for receiving information symbols and a second port for receiving an extrinsic information signal EXT2;
   a first component decoder for receiving first parity symbols, and for decoding the information symbols using the first parity symbols and an output signal of the first adder;
   a first subtractor having a third port for receiving an output of the first component decoder, and a fourth port for receiving an inverted signal of the extrinsic information signal EXT2;
   an interleaver coupled to an output of the first subtractor, for interleaving the decoded information symbols received from the first component decoder;
   a second component decoder for receiving an output of the interleaver and second parity symbols, and for decoding the information symbols from the interleaver output using the received signals;
   a deinterleaver for deinterleaving an output of the second component decoder;
   a second subtractor having a fifth port for receiving an output of the deinterleaver and a sixth port for receiving an inverted output of the first subtractor, said second subtractor having output to the second port and inverted output to the fourth port;

a hard decision device for converting output received from the first component decoder to binary information bits by hard decision decoding;

an error detector for checking for errors in the binary information bits received from the hard decision device and for generating a no error signal if no errors are detected; and an output buffer for storing the binary information bits received from the hard decision device and for outputting the stored binary information bits in response to the no error signal.

2. The iterative decoder of claim 1, wherein the first and second component decoders are operated in a continuous mode.

3. The iterative decoder of claim 1, wherein the error detector a CRC (Cyclic Redundancy Check) error checker.

4. An iterative decoding device having a predetermined maximum number of iterations, comprising:

a first component decoder, for receiving information symbols and first parity symbols, and for decoding the information symbols using the first parity symbols;

an interleaver, coupled to the first component decoder, for interleaving an order of the first decoded information symbols from an original data order;

a second component decoder, for receiving an output of the interleaver and second parity symbols, and for decoding the information symbols output from the interleaver using the second parity symbols:

a deinterleaver for deinterleaving the second decoded information symbols to recover the original data order of the information symbols; and an err detector for detecting errors in a decoded frame when the information symbols of the decoded frame are in the original data order;

wherein an output signal of the deinterleaver is fed back to the first decoder for iterative decoding, and wherein the decoded frame data is checked for errors, and, if there are no errors, the iterative decoding is stopped even though the predetermined number of iterations are not completed.

5. The iterative decoding device of claim 4, wherein the decoded frame data is received from the output of the first component decoder.

6. The iterative decoding device of claim 4, wherein the decoded frame data is received from the output of the deinterleaver.

7. The iterative decoding device of claim 4, wherein the iterative decoder further comprises:

first adder having a first port for receiving the information symbols, a second port for receiving an extrinsic information signal EXT2, and an output connected to the first component decoder;

a first subtractor having a third port for receiving an output of the first component decoder; a fourth port for receiving an inverted signal of the extrinsic information signal EXT2, and an output connected to the interleaver; and a second subtractor having a fifth port for receiving an output of the deinterleaver, a sixth port for receiving an inverted output of the first subtractor, and an output for outputting said extrinsic information signal EXT2.

8. The iterative decoding device of claim 7, wherein the error detector performs error detection on the output of the first component decoder.

9. The iterative decoding device of claim 7, wherein the first and second component decoders are operated in a continuous mode.

10. The iterative decoding device of claim 7, wherein the error detector is a Cyclic Redundancy Check (CRC) error checker.

11. The iterative decoding device of claim 7, wherein the error detector performs error detection on the output of the deinterleaver.

12. The iterative decoding device of claim 7, wherein the error detector receives the output of one of the first component decoder and the deinterleaver, and performs error detection on the output.

13. An iterative decoding method for an iterative decoder having a predetermined maximum number of iterations, comprising the steps of:

receiving information symbols and first parity symbols and performing first decoding on the information symbols using the first parity symbols;

interleaving an order of the information symbols which are first decoded with the first parity symbols from an original data order;

receiving the interleaved information symbols of which the original data order is changed and second parity symbols, and performing second decoding on the interleaved information symbols using the second parity symbols;

deinterleaving the information symbols which are second decoded with the second parity symbols to recover the original data order of the information symbols;

checking for errors on a decoded frame as the information symbols are recovered into the original final data order before the predetermined number of iterations are completed; and stopping, even though the predetermined number of iterations are not completed, the iterative decoding whenever there are no error in the decoded frame, wherein the deinterleaved signal is fed back to the first decoding step for iterative decoding.

14. The iterative decoding method of claim 13, wherein the decoded frame is achieved from the first decoding step.

15. The iterative decoding method of claim 13, wherein the decoded frame is achieved from the deinterleaving step.

16. The iterative decoding method of claim 13, wherein the step of iteratively decoding further comprises:

adding the information symbols and an extrinsic information signal EXT2; and subtracting the first-decoded information symbols and an inverted signal of the extrinsic information signal EXT2.

17. The iterative decoding method of claim 16, wherein the error checking is performed on the output of the first decoded information symbols.

18. The iterative method of claim 16, wherein the first and second decoding is operated in a continuous mode.

19. The iterative decoding method of claim 16, wherein the error checking is performed using a Cyclic Redundancy Check (CRC) error.

20. The iterative decoding method of claim 16, wherein the error checking is performed on the deinterleaved information symbols.

* * * * *